United States Patent Office 3,682,808
Patented Aug. 8, 1972

3,682,808

PHOTOPOLYMERIZABLE COMPOSITIONS CONTAINING OXYPHOSPHORANES

Carl Heinrich Krauch, Heidelberg, and Horst Hoffmann, Ludwigshafen, Germany, assignors to Badische Anilin- & Soda-Fabrik Aktiengesellschaft, Ludwigshafen (Rhine), Germany No Drawing. Filed Mar. 10, 1971, Ser. No. 122,996
Claims priority, application Germany, Mar. 14, 1970, P 20 12 221.8
Int. Cl. C08f
U.S. Cl. 204—159.15 5 Claims

ABSTRACT OF THE DISCLOSURE

Photopolymerizable compositions containing photopolymerizable ethylenically unsaturated monomeric compounds, a polymer as binder and also oxyphosphoranes. The addition of oxyphosphoranes considerably improves the photosensitivity of the photopolymerizable compositions and the constancy of said sensitivity even when they are stored for prolonged periods.

The invention relates to photopolymerizable compositions based on photopolymerizable ethylenically unsaturated compounds and containing oxyphosphoranes as photoinitiators and/or oxygen acceptors.

It is known to prepare printing plates for examples by exposing through an image-bearing transparency plates or sheets of photo-cross-linkable mixtures of soluble highly polymeric substances, such as polyamides, with unsaturated monomers most of which contain more than one photopolymerizable ethylenically unsaturated double bond, and photoinitiators and then removing the unexposed areas down to the desired depth by means of appropriate solvents for the unexposed mixture.

The photosensitivity of such photopolymerizable compositions in the plates, i.e. their ability to become insoluble at the exposed areas under the action of light depends to a considerable extent on the concentration of the free radicals formed from the photoinitiator by the action of light. However, these primary radicals are preferentially intercepted by any molecular oxygen present. For this reason, the photosensitivity of the photopolymerizable compositions slowly diminishes during storage as it is not possible, in spite of precautions, to prevent slow diffusion of oxygen into the photopolymerizable composition, for example into the material of which the plate is made.

For many applications it is therefore necessary to ascertain the photosensitivity of the photopolymerizable material afresh each time it is to be used, since, when making printing plates for example, underexposure leads to printing reliefs of inadequate hardness: the entire process of development has to be carried out in order to find the exposure time required for the reduced photosensitivity. This test is time-consuming and involves not inconsiderable wastage, as in most cases a series of tests is necessary.

Unsuccessful attempts have been made in the past to reduce this undesirable oxygen effect by adding substances such as tin(II) salts or triphenylphosphine.

It is an object of the invention to improve the sensitivity photopolymerizable compositions to light and to reduce the loss of photosensitivity during storage.

We have now found that photopolymerizable compositions containing ethylenically unsaturated monomers can be considerably improved by adding oxyphosphoranes thereto.

Accordingly, the invention relates to photopolymerizable compositions containing photopolymerizable unsaturated monomeric compounds and preferably a polymer as binding agent, which compositions also contain an oxyphosphorane in a concentration of from 0.001 to 10% by weight of the photopolymerizable compositions.

The oxyphosphoranes may be readily manufactured from α- or 1,2-dicarbonyl compounds, such as orthoquinones, substituted orthoquinones and α-diketones, and triaryl or trialkyl phosphites in the form of 1:1 adducts (cf. F. Ramirez and N. B. Desen, J. Am. Chem. Soc. 82, 2652 (1960)). The oxyphosphoranes are as a rule prepared from the said starting materials in an inert organic solvent, e.g. benzene, at room temperature. The adducts of trialkyl phosphites may also be prepared in the absence of solvents at elevated temperature in the neighborhood of 100° C. The oxyphosphoranes act as photoinitiators as well as oxygen acceptors.

Molecular oxygen causes dissociation thereof into the corresponding ortho-quinone or diketone and triaryl or trialkyl phosphate. In this way the sensitivity of the compositions to light is not only not reduced but is even increased by atmospheric oxygen. Since the dicarbonyl compounds liberated during decomposition of the oxyphosphoranes cause bathochromic displacement of the absorption edge of the photosensitive composition, its photosensitivity is increased. Thus the addition of oxyphosphoranes, which act as initiators and oxygen acceptors (in conjunction with other photoinitiators they act primarily as oxygen acceptors), shortens the exposure time of plates, coatings, sheets or films made from the photopolymerizable compositions; at any rate the presence of such oxyphosphoranes prevents undesirable increase in the exposure times required for photopolymerizable compositions containing such materials.

The amount of oxyphosphorane added is in the range 0.001 to 10%, preferably 0.1 to 5%, by weight of the photopolymerizable composition.

Particularly suitable oxyphosphoranes are the 1:1-adducts of α-diketones such as diacetyl, phenanthrene, quinone, or benzil, with triaryl or trialkyl phosphites having from 1 to 10 carbon atoms in the alkyl moiety, such as triphenyl phosphite, trimethyl phosphite, triethyl phosphite, tripropyl phosphite, tributyl phosphite, triamyl phosphite or tri-2-ethylhexyl phosphite. Phosphites containing different radicals and mixtures of different oxyphosphoranes may also be used.

Diacetyl and benzil are, by virtue of their structure, the preferred α-diketones. α-Diketones capable of changing into a tautomeric form cannot be used for the production of oxyphosphoranes.

Suitable photopolymerizable ethylenically unsaturated monomeric compounds are conventional ethylenically unsaturated monomers which may be photopolymerized alone or in the presence of a photoinitiator. Examples of monomers which, in conjunction with unsaturated polyesters in the form of conventional unsaturated polyester resins, are particularly suitable for making coatings, are styrene, acrylates and methacrylates of monohydric and dihydric aliphatic alcohols having from 1 to 12 carbon atoms, acrylic acid, methacrylic acid or their amides.

Where the photopolymerizable compositions are to be used for the production of printing plates, it is preferred to use monomers having at least two photopolymerizable ethylenically unsaturated double bonds. Minor amount thereof, i.e. amounts of less than 50% by weight, preferably less than 25% by weight, may be replaced by monomers having only one ethylenically unsaturated double bond, if such a modification of the composition is desirable. Very suitable monomers having at least two ethylenically unsaturated double bonds, particularly for use in mixture where polyamides are used as the polymeric binder, are those which have a boiling point above 100° C. at atmospheric pressure and which are compatible to the extent of at least 20% with the polymeric binders used in conjunction therewith. Highly suitable monomers contain, in addition to the double bonds, amide groups, such as amides derived from acrylic acid and/or methacrylic acid. Examples are alkylene-bis-acrylamides and methacrylamides such as methylene-bis-acrylamide, methylene-bis-methacrylamide, the bis-acrylamides and bis-methacrylamides of aliphatic, cycloaliphatic and aromatic di- or polyamines having from 2 to 12 carbon atoms, for example of ethylenediamine, propylenediamine, butylenediamine, pentamethylenediamine, hexamethylenediamine, octamethylenediamine, xylylene-diamine, and of other diamines, of tri- or polyamines, which may be branched or interrupted by heteroatoms, such as oxygen, nitrogen or sulfur atoms, Diethers obtained from 1 mole of an aliphatic diol or polyol and 2 moles of N-methylolacrylamide or N-methylolmethacrylamide are very suitable. Photopolymerizable monomers which are also very suitable are those which contain urethane or urea groups optionally in addition to amide groups, such as the reaction products of monoacrylates or monomethacrylates of aliphatic diols with diisocyanates or the corresponding reaction products of monoacrylamides or monomethacrylamides of diamines with diisocyanates. Of the nitrogenous monomers, triacrylic formal (1,3,5-triacryloylhexahydro - s - triazine) and triallyl cyanurate are also suitable. Other suitable monomers are the di-, tri- and tetra-acrylates or the corresponding methacrylates of dihydric or polyhydric alcohols and phenols, for example di- and tri-ethyleneglycol diacrylate or dimethacrylate. However, the use of difuntional or polyfunctional polymerizable monomers is not limited to the selection given above. It also includes other monomers having at least two polymerizable double bonds provided these are compatible to the extent of at least 20% with any polymeric binders which may be used in conjunction therewith, which can be readily determined by simple experiment.

Minor amounts, preferably amounts of less than 30% by weight of the total amount of monomers, of the monomers having more than one polymerizable olefinic double bond in the photopolymerizable compositions to be used for making relief plates, may be replaced by monomers having only one polymerizable olefinic double bond, such as aromatic hydrocarbons, for example styrene and vinyltoluene, acrylamides or methacrylamides and their substitution products, such as N-methylolacrylamide or N-methylolmethacrylamide or their ethers or esters, or monoesters of olefinically unsaturated carboxylic acids having from 3 to 5 carbon atoms and aliphatic diols or polyols, for example monoacrylates or monomethacrylates of ethylene glycol, diethylene glycol, triethylene glycol, glycerol, 1,1,1-trimethylolpropane and 1,4-butanediol. One factor governing their choice is the use to which the photosensitive or photopolymerizable mixtures are to be put.

Very suitable photopolymerizable or curable compositions which are of particular value for the manufacture of relief plates are those which contain from 10 to 50%, particularly from 20 to 40%, by weight of monomers and from 90 to 50%, particularly from 80 to 60%, by weight of solid polymers, such as soluble polyamides, as binders.

Suitable solid polymers which may be contained in the photopolymerizable composition, particularly in photosensitive layers such as plates, films or sheets are those solid synthetic or semi-synthetic polymers which are soluble in organic solvents and are conventionally used for the manufacture of photopolymerizable layers, particularly printing plates, e.g. the polymers listed in U.S. Pat. 2,760,863. Examples are vinyl polymers such as polyvinyl chloride, vinylidene chloride polymers, optionally partially saponified copolymers of vinyl chloride and vinyl esters of monocarboxylic acids, polymers of predominant amounts of olefinically unsaturated carboxylic acids having from 3 to 5 carbon atoms and/or their esters and/or amides, for example acrylic acid, methacrylic acid and their esters with alkanols having from 1 to 12 carbon atoms, acrylamide or methacrylamide. Polymers based on styrene or vinyl esters of monocarboxylic acids having from 2 to 11 carbon atoms, such as vinyl acetate and vinyl chloroacetate, are also suitable. Other polymers are those based on methacrylic monoesters and acrylic monoesters of aliphatic diols and polyols such as ethylene glycol, 1,4-butanediol or glycerol. Finally, it is also possible to use soluble cellulose derivatives, polyester and polyethers.

Particularly suitable polymers for use in the compositions of the invention are linear synthetic polyamides which have recurring amide groups in the main chain of the molecular and which are soluble in conventional organic, particularly alcoholic, solvents. Of these, we prefer to use a copolyamides which are soluble in conventional solvents or solvents mixtures, such as lower aliphatic alcohols, alcohol/water mixtures or mixtures of alcohols with other solvents, for example benzene/alcohol/water mixtures, or which are soluble in ketones, esters or aromatic hydrocarbons. Examples of such copolyamides are those which have been prepared in a conventional manner by polycondensation or polymerization, e.g. activated anionic polymerization, from two or more lactams having from 5 to 13 ring members. Examples of such lactams are pyrrolidone, caprolactam, enantholactam, capryllactam, laurolactam and corresponding C-substituted lactams such as C-methyl-$\epsilon$-caprolactam, $\epsilon$-ethyl-$\epsilon$-caprolactam or $\delta$-ethylenantholactam. Aminocarboxylic acids on which the lactams are based may be polycondensed instead of the lactams. Other suitable copolyamides are polycondensation products of salts of the diamine/carboxylic acid type prepared from at least three polyamide-forming starting materials. Preferred dicarboxylic acids and diamines for this purpose are aliphatic dicarboxylic acids having from 4 to 20 carbon atoms such as adipic acid, suberic acid, sebacic acid, dodecanedicarboxylic acid and corresponding substitution products such as $\alpha,\alpha$-diethyladipic acid, $\alpha$-ethylsuberic acid, reptadecanedicarboxylic acid-(1,8) or reptadecanedicarboxylic acid-(1,9) or mixtures thereof, and dicarboxylic acids containing aliphatic or aromatic ring systems. Particularly suitable diamines are aliphatic or cycloaliphatic diamines having two primary and/or secondary amino groups and having, in particular, from 4 to 20 carbon atoms, such as pentamethylenediamine, hexamethylenediamine, heptamethylenediamine, octamethylenediamine or C- and/or N-substituted derivatitves of such amines, such as N-methyl-N-ethylhexamethylenediamine, 1,6 - diamino-4-methylhexane, 4,4′-diaminodicyclohexylmethane and 4,4′-diaminodicyclohexylpropane, as well as aromatic diamines, such as m-phenylenediamine, m-xyylenediamine and 4,4′-diaminodiphenylmethane; the bridging groups between the two carboxylic acid groups methane; the bridging groups between the two carboxylic acid groups or amino groups may, in all of the said starting materials, be optionally interrupted by heteroatoms, such as oxygen, nitrogen or sulfur atoms. Particularly suitable copolyamides are those prepared by cocondensation of a mixture of one or more lactams, in particular caprolactam, and at least one salt of a dicarboxylic acid and a diamine, e.g. caprolactam, hexamethylenediammonium adipate and 4,4′-diaminodicyclohexylmethane adipate.

Suitable photoinitiators, which may be added to the photopolymerizable compositions together with the oxyphosphoranes, are conventional photoinitiators, particularly vicinal ketaldonyl compounds, for diacetyl or benzil; α-ketaldonyl alcohols such as benzoin; acyloin ethers such as benzoin methyl ether; α-substituted aromatic acyloins such as α-methylbenzoin and α-methylolbenzoin. Where the addition of such photoinitiators is desirable, they are generally added in the usual amounts, advantageously in amounts of from 0.01 to 10%, particularly from 0.01 to 3%, by weight of the photopolymerizable composition. Examples of inhibitors which may also be added to the photopolymerizable compositions in the usual amounts, for example from 0.01 to 2.0% by weight based on the whole mixture, are hydroquinone, p-methoxyphenol, p-quinone, copper(I) chloride, methylene blue, β-naphthylamine, β-naphthol, phenols or the salts of N-nitrosocyclohexylhydroxyamine.

Plates, films or sheets may be prepared from the oxyphosphorane-containing photopolymerizable compositions of the invention by conventional methods, for example by dissolving the components, removing the solvent and then molding, extruding or rolling the finely divided mixture. Another method is to cast sheets or films from the solutions of the components of the photopolymerizable compositions. The oxyphosphoranes are preferably added to the solutions of the components of the photopolymerizable composition before they are processed into photosensitive layers or coatings. Alternatively, they may be added to the finished mixture just before it is to be used for making photosensitive layers. In any case, care must be taken to ensure that the oxyphosphoranes are uniformly dispersed throughout the layer.

Light sources which are suitable for exposing the photopolymerizable compositions are lamps which emit light having a wavelength of from 200 to 700 mμ, such as carbon arc lamps, mercury vapor lamps, xenon lamps and fluorescent tubes. The invention is further illustrated by the following examples. The parts and percentages given in the following examples and comparative tests are by weight unless otherwise stated.

EXAMPLES 1 TO 20

In each experiment, 22 parts of the diether of 1 mole of ethylene glycol with 2 moles of N-methylolacrylamide, 20 parts of m-xylyene-bisacrylamide, 8 parts of triethylene glycol diacrylate and the oxyphosphoranes given in Table 1 below are dissolved in 100 parts of formamide with and without the addition of benzoin methyl ether. Table 1 lists the oxyphosphoranes which are used and the amounts in which they are added to the various mixtures, and also gives the amount, when added, of benzoinmethyl ether (BME) used. In each experiment, 2 ml. of the solution are placed in a quartz tube and then exposed in an exposure unit having Osram lamps (type L 40 W/70) as the light source. The temperature changes occurring in the mixtures during exposure are followed by means of an immersed iron/constantan thermocouple connected to a millivolt recording instrument (araphic recorder) (measuring range to 1 to 5 millivolts). The following values are determined:

(a) $t_{ind.}$: induction period, i.e. the time from the commencement of exposure to the point at which polymerization starts, as indicated by a rise in temperature;

(b) $t_{max.}$: maximum time, i.e. the period from the commencement of exposure to the point where the heat of polymerization reaches a maximum;

(c) Max. peak height: the maximum temperature reached; the height or the temperature peak is given in mm.

Table 1 gives further details of the tests and the results obtained. Mixtures, to which trimethylol phosphite, triphenyl phosphite and triphenyl phosphine were added as a sole initiator in an amount of 0.5% exhibited no polymerization on exposure.

TABLE I

| Ex. No. | Oxyphosphorane added, adduct of: (percent) | BME added (percent) | Duration of $O_2$-flushing (min.) | Interval between $O_2$-flushing and exposure (min.) | $t_{inf.}$ (sec.) | $t_{max.}$ (sec.) | Max. peak height (mm.) |
|---|---|---|---|---|---|---|---|
| A (comp. experiment). | | 0.1 | 0 | 0 | 7.7 | 55.0 | 133 |
| B (comp. experiment). | | 0.1 | 20 | 0 | 37.4 | 9.35 | 134 |
| 1 | Diacetyl/trimethyl phosphite (0.5) | | 0 | 0 | 3.5 | 146.0 | 81.5 |
| 2 | do | | 5 | 0 | 26.6 | 110.0 | 118 |
| 3 | do | | 5 | 30 | 2.6 | 88.0 | 117 |
| 4 | do | 0.1 | 0 | 0 | 4.2 | 59.4 | 131.5 |
| 5 | do | 0.1 | 15 | 0 | 9.0 | 55.4 | 153.0 |
| 6 | do | 0.1 | 15 | 30 | 2.5 | 48.8 | 147.5 |
| 7 | Diacetyl/triethyl phosphite (0.5) | | 0 | 0 | 15.4 | 132 | 82 |
| 8 | do | | 5 | 0 | 17.6 | 81.4 | 151 |
| 9 | do | | 5 | 5 | 3.3 | 70.4 | 148 |
| 10 | do | 0.1 | 10 | 0 | 11.0 | 55.0 | 173 |
| 11 | do | 0.1 | 10 | 5 | 0 | 44.0 | 166 |
| 12 | Benzyl/trimethyl phosphite (0.5) | | 0 | 0 | 3.3 | Slow rise | |
| 13 | do | | 5 | 0 | 10.0 | 60.5 | 100 |
| 14 | do | | 10 | 0 | 10.0 | 90.6 | 123 |
| 15 | do | 0.1 | 5 | 0 | 8.8 | 77 | 135 |
| 16 | Benzyl/triethyl phosphite (0.5) | | 0 | 0 | 6.2 | Slow rise | |
| 17 | do | | 5 | 0 | 24.2 | 61.6 | 99.5 |
| 18 | do | | 20 | 0 | 22.0 | 69.3 | 118.5 |
| 19 | Benzyl/triphenyl phosphite (0.1 saturated) | | 0 | 0 | 22 | 61.6 | 79.5 |
| 20 | do | | 5 | 0 | 92.4 | 156.2 | 122 |
| 21 | do | | 10 | 0 | 92.4 | 156.2 | 122 |

EXAMPLES 22 TO 29

In each experiment, 100 parts of a copolyamide of equal parts of caprolactam, hexamethylenediamine adipate and bis(4-aminocyclohexyl) methane adipate, 22 parts of the diether of 1 mole of ethylene glycol with 2 moles of N-methylolacrylamide, 20 parts of m-xylylene-bisacrylamide, 8 parts of triethylene glycol diacrylate, 1 part of oxyphosphorane and 0.1 part of the sodium salt of N-nitrosocyclohexylhydroxylamine are dissolved in 300 parts by volume of methanol. Photopolymer plates are cast from the solutions and then exposed on a flat-plate unit to the light of Osram lamps (type L 40 W/70), the exposure time necessary for achieving a good relief being determined in each case. Following washout of the unexposed areas of the plate with an alcohol/water mixture there are obtained relief plates which exhibit the characteristics and mechanical properties required for printing purposes.

Table 2 lists the intiators (oxyphosphorane and/or benzoin methyl ether (BME)) and the quantity thereof used and indicates the necessary exposure times in comparison with the exposure time required when 1 part of benzoin methyl ether (BME) is added as sole initiator (comparative Experiment C). It can be seen from the table that the oxyphosphoranes themselves act as initiators and reduce the exposure time when added to BME-containing photopolymer plates.

TABLE 2

| Ex. No. | Oxyphosphorane added, adduct of: (parts) | BME added (parts) | Exposure time in percent of exposure time required in com. experiment C taken to be 100% |
|---|---|---|---|
| C | | 1 | 100 |
| 22 | Diacetyl/trimethyl phosphite (1) | | 300 |
| 23 | do | 1 | 60-80 |
| 24 | Diacetyl/triethyl phosphite (1) | | 300 |
| 25 | do | 1 | 60-80 |
| 26 | Benzyl/trimethyl phosphite (1) | | 100 |
| 27 | do | 1 | 80-90 |
| 28 | Benzyl/triphenyl phosphite (1) | | 100 |
| 29 | do | 1 | 80 |

We claim:

1. Photopolymerizable compositions containing photopolymerizable ethylenically unsaturated monomeric compounds, said compositions also containing an oxyphosphorane in an amount of from 0.001 to 10% by weight of the photopolymerizable composition wherein said oxyphosphorane is a 1:1 adduct of a triaryl or trialkyl phosphite having from 1 to 10 carbon atoms on the alkyl moiety with an alpha-dicarbonyl compound.

2. Photopolymerizable compositions as claimed in claim 1 consisting, at least to a major extent, of a mixture of:

(a) from 10 to 50% by weight of at least one monomeric compound having at least two photopolymerizable ethylenically unsaturated double bonds, and (b) from 50 to 90% by weight of a binder consisting of a synthetic polymer which is solid at room temperature and is soluble in an organic solvent.

3. Photopolymerizable compositions as claimed in claim 1 consisting, at least to a major extent, of a mixture of:

(a) a blend of at least one monomeric compound having at least two photopolymerizable ethylenically unsaturated double bonds with less than 30% by weight, based on the total monomers, of at least one monomeric compound having only one photopolymerizable ethylenically unsaturated double bond, and (b) from 50 to 90% by weight of a binder consisting of a synthetic polymer which is solid at room temperature and is soluble in an organic solvent.

4. Photopolymerizable compositions as claimed in claim 1, wherein the added oxyphosphorane is a 1:1 adduct of a triaryl or trialkyl phosphite having from 1 to 10 carbon atoms in the alkyl moiety with an α-dicarbonyl compound selected from group consisting of diacetyl, benzil and phenanthrene quinone.

5. Photopolymerizable compositions as claimed in claim 1, which also contain from 0.01 to 10% by weight, based on the photopolymerizable composition, of a further photoinitiator.

References Cited

UNITED STATES PATENTS

| | | | |
|---|---|---|---|
| 2,957,931 | 10/1960 | Hamilton | 204—159.23 |
| 3,331,761 | 7/1967 | Mao | 204—159.23 |
| 3,368,900 | 2/1968 | Burg | 204—159.23 |
| 3,427,161 | 2/1969 | Laridon | 204—159.23 |

PAUL LIEBERMAN, Primary Examiner

U.S. Cl. X.R.

204—159.17, 159.18, 159.19, 159.23